(12) United States Patent
Schuman

(10) Patent No.: US 8,566,384 B2
(45) Date of Patent: Oct. 22, 2013

(54) MULTIPLICATIVE GROUP COUNTER

(75) Inventor: David Steven Schuman, Rolling Meadows, IL (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 1689 days.

(21) Appl. No.: 11/956,082

(22) Filed: Dec. 13, 2007

(65) Prior Publication Data

US 2009/0157789 A1 Jun. 18, 2009

(51) Int. Cl.
*G06F 7/52* (2006.01)
(52) U.S. Cl.
USPC .......................... 708/620; 708/490; 708/625
(58) Field of Classification Search
None
See application file for complete search history.

(56) References Cited

U.S. PATENT DOCUMENTS

| 4,037,085 | A | | 7/1977 | Minorikawa |
| 6,018,560 | A | * | 1/2000 | Kim .............................. 377/123 |
| 6,883,011 | B2 | | 4/2005 | Rumynin et al. |
| 7,092,480 | B1 | | 8/2006 | Younis |
| 2001/0055388 | A1 | | 12/2001 | Kaliski, Jr. |

* cited by examiner

*Primary Examiner* — Michael D Yaary
(74) *Attorney, Agent, or Firm* — Tarolli, Sundheim, Covell & Tummino LLP

(57) ABSTRACT

Systems and methods are provided for efficiently counting detected events via a multiplicative group counter. An equivalent class polynomial congruent with a first of a plurality of elements comprising a multiplicative group is represented as a series of binary values. The represented polynomial is subjected to a state transition function as each event is detected, such that the series of binary values is altered to represent a new equivalent class polynomial congruent with a second of the plurality of elements of a multiplicative group. The series of binary values is decoded to determine a number of detected events recorded by the counter.

19 Claims, 3 Drawing Sheets

MULTIPLICATIVE GROUP COUNTER

TECHNICAL FIELD

The present invention relates generally to digital logic, and more particularly to a digital counter based on finite field theory.

BACKGROUND OF THE INVENTION

A number of digital counter designs are well-known in the art, including binary counters, one-hot counters, binary-coded decimal counters, and similar devices. Each of these counter designs finds application in different designs. For example, binary counters are very efficient, with an n-bit binary counter providing a capacity of $2^n$ counts. Unfortunately, propagation delays produced by the carry operations required by binary counters hinder their overall performance, leaving them poorly suited for high speed applications. Conversely, one-hot counters provide excellent performance, but an n-bit counter can provide a capacity of only n counts. In many logic devices, such as field programmable gate arrays (FPGA) and complex programmable logic devices (CPLA), there is insufficient circuitry for the sheer number of components required to implement a one-hot counter of any significant count capacity. A Johnson counter architecture can cut the necessary number of components in half, but remains impractical for high speed, high capacity counters in programmable devices.

SUMMARY OF THE INVENTION

In accordance with an aspect of the present invention, a method is provided for efficiently counting detected events via a multiplicative group counter. A polynomial from a multiplicative group is represented as a series of binary values. The represented polynomial is subjected to a state transition function as each event is detected, such that the series of binary values is altered to represent a new polynomial from the multiplicative group. The series of binary values is decoded to determine a number of detected events recorded by the counter.

In accordance with another aspect of the present invention, a multiplicative group counter system is provided for recording the number of events detected from an event source. A register stores a series of values representing coefficients of one of a plurality of equivalent class polynomials. Each equivalent class polynomial is congruent to an element of a multiplicative group. Congruency is established by a primitive polynomial. A state transfer function causes the series of values stored in the register to cycle through the plurality of equivalent class polynomials in a known sequence in response to events detected from the event source, such that the number of events detected from the event source is represented by the series of values representing the coefficients stored in the register.

In accordance with yet another aspect of the present invention, a multiplicative group counter apparatus is provided for recording the number of events detected from an event source. A multiplicative group counter is realized as a series of flip-flops each having an input, a clock input, and an output. Since algebra rooted in finite field theory is used to manipulate the elements of the counter the counter can be implemented as a linear state machine.

DETAILED DESCRIPTION OF INVENTION

Methods and systems are provided for efficiently counting detected events via a multiplicative group counter. In a multiplicative group counter, a plurality of elements represent the coefficients of an univariate polynomial $f(x)$ congruent with the elements of a multiplicative group of the finite field $GF(2^n)$. The state transition function $\lambda\{\ \}$ of a multiplicative group counter implements $x^{+1} \cdot f(x)$ to increment and $x^{-1} \cdot f(x)$ to decrement. An n-bit register r such that r(t) is r at time t and $f(r(t)) \mapsto f(x)$ then as r(t) is subjected to a state transition $\lambda\{\ \}$ function as each event is detected, the represented polynomial and the state transition function $f(x)$. The value in the register can be compared to a desired end state or otherwise decoded to determine when a desired number of events have been detected.

Figure 1:
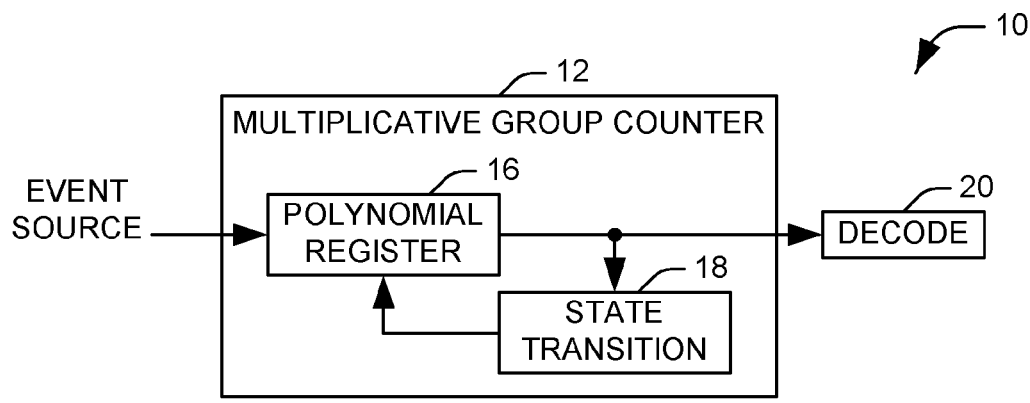
FIG. 1 illustrates a system incorporating a multiplicative group counter in accordance with an aspect of the present invention.

FIG. 1 illustrates a system 10 incorporating a multiplicative group counter 12 in accordance with an aspect of the present invention. The illustrated system 10 operates according to multiplication as opposed to addition according to principles of finite field theory. Specifically, the multiplicative group counter 12 cycles through a set of coefficients associated with a set of equivalent class polynomials congruent with the elements of the multiplicative group of a Galois Field. A Galois Field always has a number of elements, referred to as its order, equal to a prime number or an integer power of a prime number. Powers of two tend to work best with digital logic, and hereinafter, for the purpose of illustration, the Galois Fields discussed herein will be described as having an order of $2^n$, where n is an integer greater than one. It will be appreciated, however, that the systems and methods claimed herein are not limited to such a configuration. One of the elements in the Galois field is the additive identity zero, an element not included in the multiplicative group and that will not be used in the counting process. Accordingly, each counter represents a multiplicative group of $2^n-1$ polynomials, that is, all of the non-zero polynomials comprising a Galois field, allowing a given multiplicative group counter to represent $2^n-1$ unique values. In this form, the multiplicative group counter can readily be implemented in any of a number of digital logic devices including application specific integrated circuits, programmable logic devices, field programmable gate arrays, complex programmable logic devices, and programmable array logic devices.

A primitive polynomial is an irreducible polynomial of degree n that produces a congruency between set of elements of a multiplicative group and a set of polynomials such that the order of both sets are equal. By a congruency, it is meant that satisfies the following condition. Let M be the set of elements of the multiplicative group and P the set of polynomials on division of an irreducible polynomial I. Then for any m∈M and any p∈P, m is congruent to p if m−p is a multiple of I, that is m=p+k·I. When that is true then the congruency can be expressed as m≡p(mod I). Note, in the case of finite fields addition and subtraction is not conventional addition and subtraction. Since the Galois field is commutative and associative over multiplication, the product of a value and the remainder of a given polynomial divided by the primitive polynomial is congruent to the product of the polynomial and the value modulo the primitive polynomial. Accordingly, a multiplicative group counter can continually perform a modulo multiplication of an equivalent polynomial by a polynomial from the multiplicative group (e.g., a first degree polynomial having no zeroth degree term) to cycle through a series of equivalent polynomial values until a desired end value is reached.

A starting value is generated for the counter 12 from a traditional binary value as set of coefficients representing an equivalent class polynomial congruent with meM multiplicative group. It will be appreciated that the representation of the binary value as an equivalent polynomial will take the form of a series of n binary digits representing the coefficients of an n−1 degree equivalent class polynomial, where the counter is an n-bit counter having the capacity to count $2^n-1$ events. Since the progression of the counter through the equivalent class polynomials representing the multiplicative group is cyclical, any non-zero starting value can be determined arbitrarily, as the state of the counter after a given number of events can be determined for any starting value. The encoded starting value is provided to the counter 12 which is stored in the counter 12 as a polynomial coefficient register 16 containing the coefficients of the equivalent class polynomial.

As each event is received from an event source, the equivalent class polynomial represented by the polynomial coefficient register 16 is transitioned to according to a state transition element 18. The state transition element 18 is a collection of digital logic circuitry that causes the polynomial coefficient register 16 to transition through a set of equivalent class polynomials of the polynomials comprising the multiplicative group represented by the counter 12 according to an associated state transition function. For example, the state transition function 18 for an up counter for a given multiplicative group can be represented as:

$$f(x)_{t+1} = \lambda\{(f(x)_t \cdot x)[\bmod p(x)]\} \qquad \text{Eq. 1}$$

where t is an index representing iterations of the polynomial function, $f(x)$ through the state transition function, and $p(x)$ is an $n^{th}$ degree primitive polynomial The function $\deg(f(x))$ returns the maximum of the all the degrees of all terms in the polynomial $f(x)$. Since by design the degree of $f(x)$ is less than or equal to n−1, the degree of the product of $f(x)$ and x is less than or equal to n. The practical effect of this state transition function 18 described in Equation 1 upon the n-bit polynomial coefficient register 16 is to shift the value of each bit within the register to a next significant bit. In the case when the degree of $f(x)$ is equal to n−1, the degree of the product $f(x)*x$ is equal to n. To maintain congruency with the multiplicative group, the relationship m=p+k·I must be satisfied. Substituting yields $[f(x)_t] \cdot x = [f(x)_{t+1}] + k \cdot p(x)$. Therefore, $[f(x)_{t+1}] = [f(x)_t \cdot x] - k \cdot p(x)$. Since the degree of $f(x)*x$ is less than or equal to n, the only value for k is 0 or 1. The state transition function can be expressed as:

$$\lambda\{[f(x)_t]\} = \begin{cases} [f(x)_t] \cdot x^1 & \deg(f(x)_t) < n-1 \\ [f(x)_t] \cdot x^1 + p(x)_n & \deg(f(x)_t) = n-1 \end{cases} \qquad \text{Eq. 2}$$

It will be appreciated that subtraction modulo 2 is the same as addition modulo 2. When the most significant bit is equal to one, the modulo function essentially represents a subtraction addition (i.e., addition) of the primitive polynomial to the equivalent class polynomial represented by the register. The condition $\deg([f(x)_t])=n-1$ can be determined by examining the most significant bit of the register.

Similarly, the state transition function 18 for a down counter for a given multiplicative group can be represented as:

$$f(x)_{t+1} = \lambda\{(f(x)*x^{-1})[\bmod p(x)]\} \qquad \text{Eq. 3}$$

where t is an index representing iterations of the polynomial function, $f(x)$, and $p(x)$ is an $n^{th}$ degree primitive polynomial for the multiplicative group of polynomials associated with the counter.

The function $\text{lst}(f(x))$ returns the minimum of all the degrees of all of the terms in the polynomial $f(x)$. Since by design the degree of $f(x)$ falls between zero and n−1, the degree of the product $f(x)*x^{-1}$ will fall between negative one and n−2. The practical effect of this state transition function 18 described in Equation 3 upon the n-bit polynomial coefficient register 16 is to shift the value of each bit within the register to a next least significant bit position. In the case when the degree of the least significant term is zero, the degree of least significant term of the product $[f(x)_t] \cdot x^{-1} = \text{lst}([f(x)_t] \cdot x^{-1}) = -1$. To maintain congruency with the multiplicative group, m=p+k·I must be satisfied. Substituting yields $[f(x)_t] \cdot x^{-1} = [f(x)_{t+1}] + k \cdot p(x)$. Therefore, $[f(x)_{t+1}] = [f(x)_t \cdot x^{-1}] - k \cdot p(x)$. Since the degree of the least significant term $\text{lst}([f(x)_t] \cdot x^{-1}) \le 0$, the only value for k is 0 or 1. The state transition function can be expressed as:

$$\lambda([f(x)_t]) = \begin{cases} x^{-1}[f(x)_t] & \text{lst}(f(x)_t) > 0 \\ x^{-1}([f(x)_t] + p(x)_n) & \text{lst}(f(x)_t) = 0 \end{cases} \qquad \text{Eq. 4}$$

It will be appreciated that subtraction modulo 2 is the same as addition modulo 2. When the least significant bit is equal to one, the modulo function essentially represents an addition of the primitive polynomial to the equivalent class polynomial represented by the register. The condition $\text{lst}([f(x)_t])=0$ can be determined by examining the least significant bit of the register.

Since the remainder of a polynomial divided over the primitive polynomial will always be equal to the polynomial unless the polynomial function is of degree 0, the practical effect of this state transition function 18 described in Equation 4 upon the n-bit polynomial coefficient register 16 is to shift the value of each bit within the register to a less significant bit unless the least significant bit within the register is one. When the least significant bit is equal to one, the modulo function essentially represents an addition of the primitive polynomial to the equivalent polynomial represented by the register 16.

The value in the polynomial coefficient register 16 at a given iteration can be read by a decoder 20 to determine if an ending value has been reached. For example, a desired ending value can be determined and translated to an equivalent class polynomial. The decoder 20 can perform a comparison between the value in the polynomial coefficient register 16 and the encoded ending value after each iteration to determine if a desired number of events has been recorded. Alternatively, the polynomial coefficients from the register 16 can be retrieved and the coefficients representing the equivalent class polynomial can be translated to a traditional binary number via a look-up table or other appropriate means.

Figure 2:
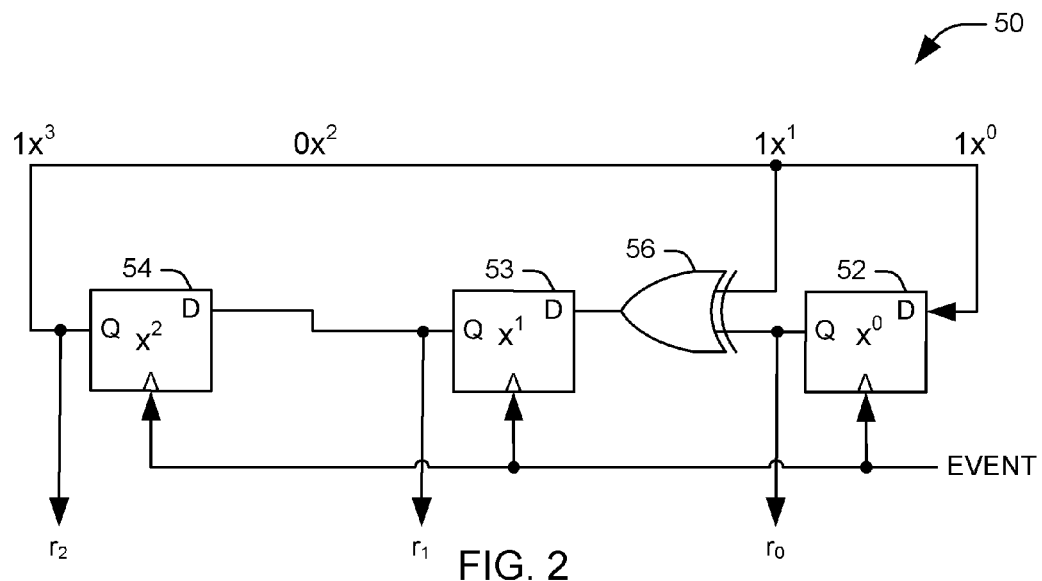
FIG. 2 illustrates one implementation of a multiplicative group counter in accordance with an aspect of the present invention.

FIG. 2 illustrates one implementation of a counter 50 in accordance with an aspect of the present invention. The illustrated counter 50 is a three-bit up counter that is operative to cycle among seven values. It will be appreciated, however, that the illustrated counter is provided merely as an example of the larger inventive concept, and that other configurations of counters based upon multiplicative groups, in accordance with an aspect of the present invention, can be utilized.

In the illustrated counter 50, the coefficients of a second degree equivalent class polynomial representing one element of a multiplicative group can be stored in three flip-flops 52-54. Each of the plurality of flip-flops 52-54 represents the coefficient of one term in the equivalent polynomial, with a first flip-flop 52 representing the coefficient of an $x^0$ term, the second flip-flop 53 representing the coefficient of an $x^1$ term, and a third flip-flop 54 representing the coefficient of an $x^2$ term. Events detected from an event source are received at a clock input of each flip-flop 52-54, such that the values within the flip-flops are shifted right, reflecting a multiplication of the equivalent class polynomial by x. At least one pair of flip-flops (e.g., 52 and 53) is separated by an XOR gate 56 that receives as a first input the output of a first flip-flop (e.g., 52) of the pair of flip-flops and as a second input, the output of a third flip-flop 54, representing a most significant bit. It will be appreciated, however that the use of an XOR gate is merely an example for demonstrating the function of the device, and that other configurations of logical gates could be utilized to perform this function.

The XOR gates 56 are positioned to represent coefficients of a primitive polynomial that establishes the congruency of the equivalent class polynomials to the elements of the multiplicative group. Specifically, the terms in the primitive polynomial having a coefficient of one can be represented by positioning for each term an XOR gate that provides an input to the flip-flop (e.g., 53) representing that term. Terms in the primitive polynomial having a coefficient of zero will not factor into a modulo-2 subtraction of the primitive polynomial from the value stored in the register, and can be represented, effectively, by the absence of an XOR gate. It will be appreciated that all $n^{th}$ degree primitive polynomials for an n-bit counter, will have an $x^n$ term that is represented implicitly, since the coefficient of the $x^n$ term of an $n^{th}$ degree primitive polynomial is one and the subtraction will only occur when the $x^{n-1}$ term of the polynomial represented in the register has a coefficient of one. In addition, for the multiplicative group utilized in the illustrated example, all primitive polynomials will have a coefficient of one for the $x^0$ term, represented by the feedback of the output of a last flip-flop 54 in the series to the input of the first flip-flop 52 in series. Accordingly, the placement of the one or more XOR gates 56 in the counter 50 will represent the intermediate terms in the primitive polynomial, that is, the terms between $x^0$ and $x^n$ for an nth degree primitive polynomial. As the value of n increases, the number of primitive polynomials of the appropriate degree will increase geometrically. Accordingly, the primitive polynomial represented by the one or more XOR gates 56 can be selected to reduce the amount of logic necessary to implement the counter. In the illustrated implementation, the represented primitive polynomial is $x^3+x+1$.

During operation, as long as the value in a third flip-flop 54 is zero, the content of a given flip-flop (e.g., 52) shifts unchanged through one of the XOR gates (e.g., 56) to the following flip-flop 53. When the equivalent class polynomial represented by the flip-flops 52-54 reaches a degree of three, such that the value held in the third flip-flop 54 is one, a logical high (e.g., a value of one) is provided to all of the at least one XOR gates 56 such that the coefficients of the primitive polynomial are subtracted from the value held in the register. The overall effect is to subtract the coefficient values of the primitive polynomial from the coefficient values of the $n^{th}$ degree polynomial represented by the flip-flops as to produce a series of coefficients representing a lower degree equivalent class polynomial that is congruent to the $n^{th}$ degree equivalent polynomial modulo the primitive polynomial. At desired intervals, for example, after each count, the values stored in the series of flip-flops 52-54 can be decoded or compared to known values to determine the number of events that have been recorded by the counter 50. For example, a look-up table can be consulted at desired intervals to determine the number of events that have been received or a series of logic gates can be used to compare the value in the register to a desired end value after each event is received.

Figure 3:
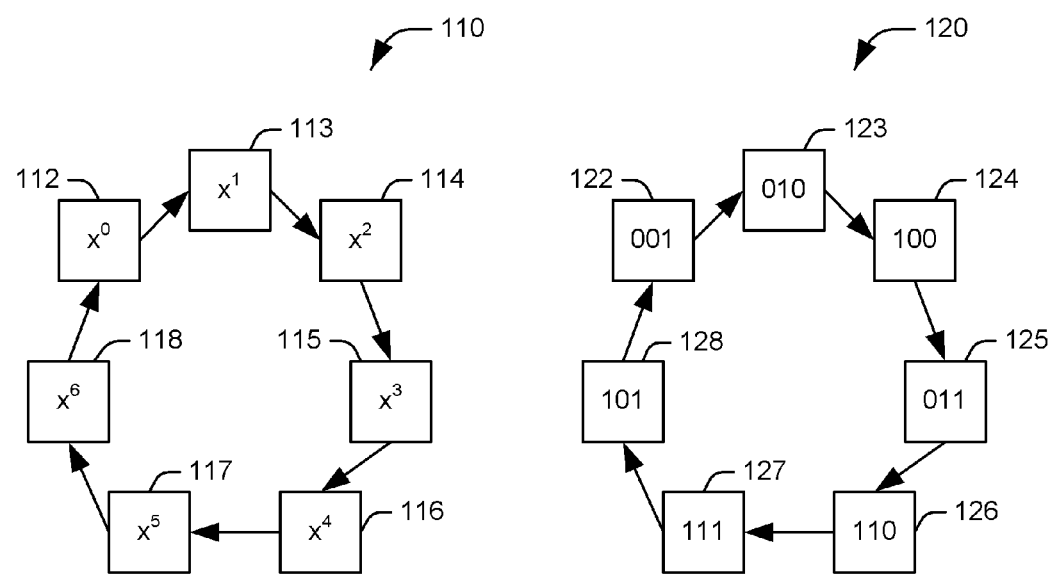
FIG. 3 is a chart illustrating the progression of the coefficient values of a three-bit multiplicative group counter.

FIG. 3 illustrates a cyclic progression through a multiplicative group 110 of polynomials 112-118 and a group 120 of register values 122-128 representing their associated equivalent class polynomials. The illustrated multiplicative group 110 comprises the polynomials 1 ($x^0$), x, $x^2$, $x^3$, $x^4$, $x^5$, and $x^6$. Along with zero, these polynomials represent a Galois Field of order 8 ($2^3$). An equivalent class polynomial can be determined for each of these polynomials as the modulo of the polynomial by a third degree primitive polynomial. In the illustrated progression, the primitive polynomial is $x^3+x+1$, giving the following equivalent polynomials for the multiplicative group:

TABLE 1

| MULTIPLICATIVE GROUP ELEMENTS | EQUIVALENT CLASS POLYNOMIAL |
| --- | --- |
| $x^0$ | 1 |
| x | x |
| $x^2$ | $x^2$ |
| $x^3$ | x + 1 |
| $x^4$ | $x^2$ + x |
| $x^5$ | $x^2$ + x + 1 |
| $x^6$ | $x^2$ + 1 |

During operation, the register might be set to 001, representing the polynomial 1. As each event is received, the polynomial is multiplied by x, giving a value of x (010) after the first event and a value of $x^2$ (100) after a second event. When a third event is received, a third multiplication results in $x^3$, a polynomial having a degree equal to that of the primitive polynomial. At this point, the primitive polynomial can be subtracted via modulo-2 subtraction, which is equivalent to modulo-2 addition, from the polynomial represented by the register, effectively removing the $x^3$ term and leaving the remainder of the primitive polynomial (x+1) as the equivalent class polynomial for $x^3$. At the fourth event, another factor of x is multiplied in, giving $x^2$+x (101). Another subtraction is required at the fifth event, as a third degree polynomial, $x^3+x^2$, is achieved. After the subtraction, the register represents the polynomial $x^2$+x+1 (111). A sixth event requires yet another subtraction, leaving $x^2$+1 (101). Finally, after a seventh event, the value returns to 1 (001). Since there are seven unique values in the cycle, the counter can accurately count up to seven events.

Figure 4:
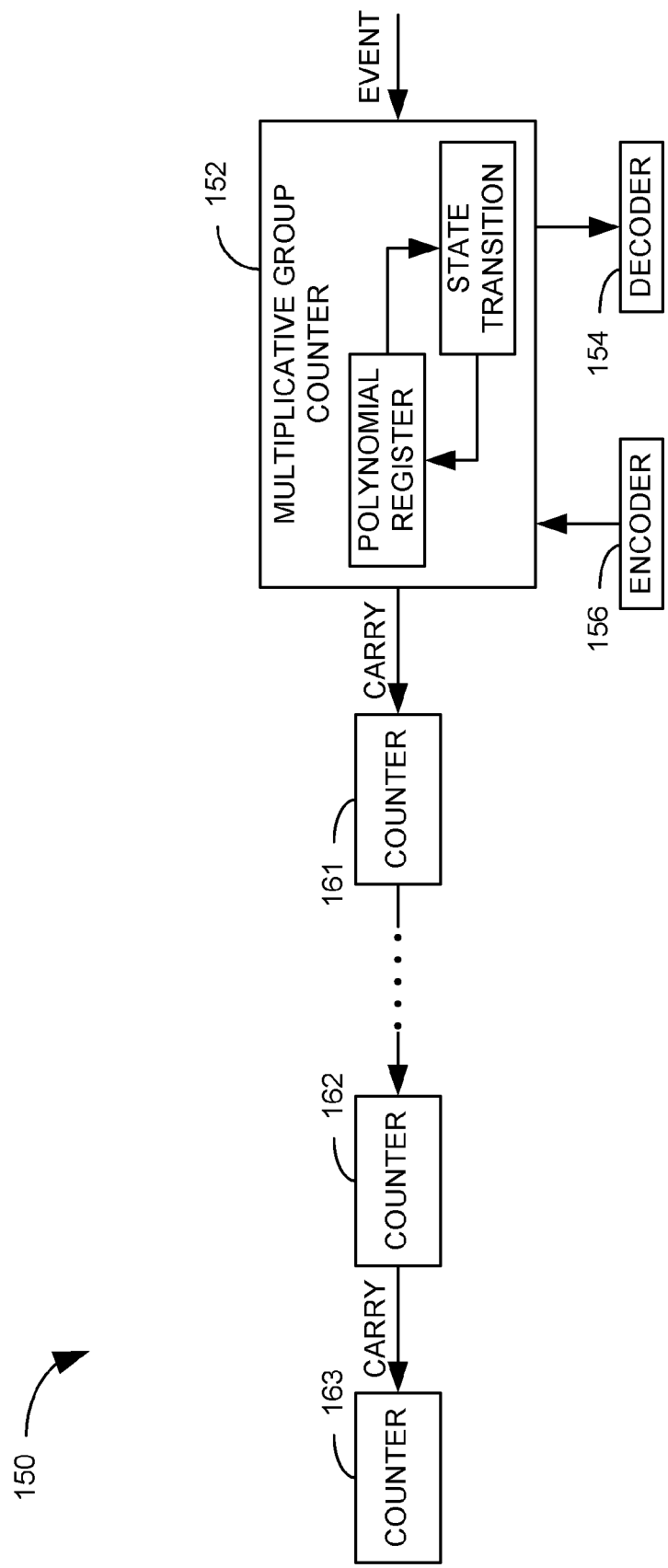
FIG. 4 illustrates a functional block diagram of an implementation of a counter system in accordance with an aspect of the present invention.

FIG. 4 illustrates a functional block diagram of an implementation of a counter system 150 in accordance with an aspect of the present invention. The counter system 150 includes a multiplicative group counter 152 that begins at an initial value, representing one polynomial in the multiplicative group, provided by an encoder 154. For example, the encoder 154 can comprise an algorithm or a look-up table that converts a binary value to a string of bits representing a polynomial from the multiplicative group. Similarly, a decoder 156, comprising a series of comparators or a look-up table, can decode the string of bits in the counter to determine a number of events represented by the bit string.

In accordance with an aspect of the present invention, the multiplicative group counter 152 can be relatively small, for example, having a capacity between four and eight bits. For a smaller multiplicative group counter, the complexity of the encoding and decoding operations is significantly reduced. When the maximum value of the multiplicative group counter is reached, a carry operation can provide an event to one or more other counters 161-163. The other counters can be implemented, for example, as additional multiplicative group counters or as normal binary counters.

Where multiplicative group counters are used, each counter 161-163 can also be kept relatively small to simplify the encoding and decoding operations at the individual counters. The carry operations will occur relatively infrequently, such that the speed advantage of the multiplicative group counters is retained. In one implementation, a thirty-two bit counter can be implemented as four eight-bit multiplicative group counters. Where the one or more counters 161-163 are binary counters, the number of carry operations will still be sharply reduced from a traditional binary counter. The binary counter will increment only when the multiplicative group counter completes a full cycle through its range of values. Accordingly, in an exemplary implementation of a thirty-two bit counter with an eight-bit multiplicative group counter and a twenty-four bit binary counter, the binary counter will be incremented every two hundred and fifty-five events, sharply reducing delays due to carrying in the system overall.

Figure 5:
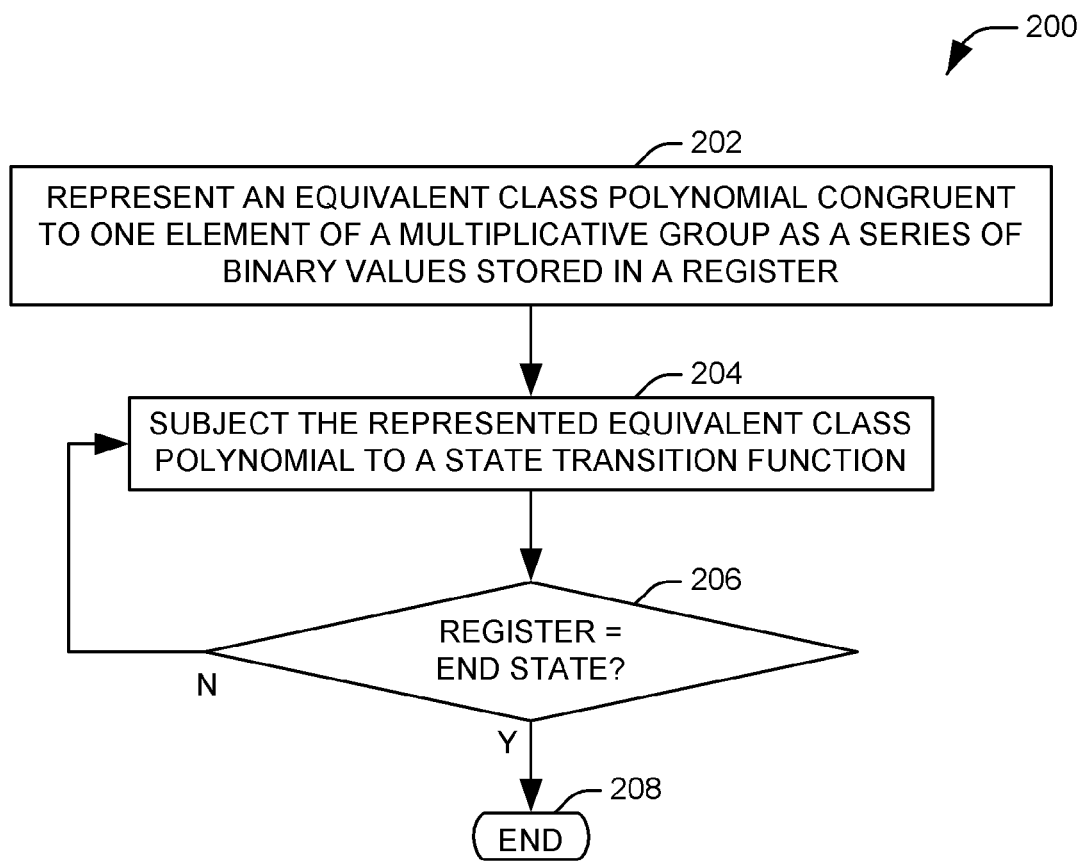
FIG. 5 illustrates an example of a methodology for high speed digital counting in accordance with an aspect of the present invention.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 5 illustrates a method 200 for efficiently counting detected events. At 202, a series of binary values representing an element from a multiplicative group is stored in a register. For example, an equivalent class polynomial of degree n−1, where n is the number of bits desired for the counter, can be determined for a given element as the remainder of a polynomial division of the element and a primitive polynomial of degree n associated with the multiplicative group. The represented element is thus congruent to the equivalent polynomial modulo the primitive polynomial.

At 204, the represented equivalent class polynomial is subjected to a state transition function as each event is detected, such that the series of binary values is altered to represent a new element from the multiplicative group. For example, the represented equivalent class polynomial can be multiplied by an element within the multiplicative group or the inverse of an element within the multiplicative group to produce an intermediate product. In practice, by a first degree polynomial having a coefficient of zero for the zeroth degree term can be utilized, such that the multiplication can be implemented as a shifting of values through a series of flip-flops. A remainder value can then be determined as the intermediate product modulo a primitive polynomial of a desired degree that is associated with the multiplicative group. Where the represented polynomial is multiplied by a first degree polynomial, the remainder value can be determined by subtracting the primitive polynomial from the intermediate product via modulo-2 subtraction whenever the degree of the intermediate product equals the degree of the primitive polynomial.

At 206, the series of binary values in the register can be decoded to determine if the counter has reached a predetermined end state, indicating that a desired number of counts have been recorded. For example, the series of binary values can be compared to a second, predetermined series of binary values representing an element in the multiplicative group as each event is detected. If the end state has not been achieved (N), the methodology returns to 204 to subject the represented polynomial to the state transition function. If the desired end state has been achieved (Y), the methodology terminates at 208.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

Having described the invention, the following is claimed:

1. A method for efficiently counting detected events in a programmable logic device, comprising:
   representing an equivalent class polynomial congruent with a first of a plurality of elements comprising a multiplicative group as a series of binary values;
   subjecting the represented polynomial to a state transition function as each event is detected, such that the series of binary values is altered to represent a new equivalent class polynomial congruent with a second of the plurality of elements of a multiplicative group that represents a number of detected events; and
   decoding the series of binary values to determine the number of detected events.

2. The method of claim 1, wherein representing an equivalent class polynomial congruent with an element of a multiplicative group comprises:
   determining an equivalent class polynomial of degree n−1, where n is a positive integer greater than one, where a primitive polynomial of degree n produces a congruency between the represented equivalent class polynomial and the first element of the plurality of elements comprising the multiplicative group, such that the equivalent polynomial is equal to the first element of the plurality of elements comprising multiplicative group modulo the primitive polynomial; and
   encoding the coefficients of the equivalent class polynomial as a series of binary values.

3. The method of claim 1, wherein subjecting the represented equivalent class polynomial to a state transition function comprises:
   multiplying the represented equivalent class polynomial by a polynomial that is one of the plurality of elements comprising the multiplicative group to produce an intermediate product; and
   determining a remainder value as the intermediate product modulo a primitive polynomial of a desired degree.

4. The method of claim 3, wherein multiplying the represented equivalent class polynomial by a polynomial that is one of the elements comprising the multiplicative group comprises multiplying the represented equivalent class polynomial by a first degree polynomial having a coefficient of zero for the zeroth degree term.

5. The method of claim 4, wherein multiplying the represented equivalent class polynomial by a first degree polynomial comprises providing an event input to a clock input of each of a series of flip-flops.

6. The method of claim 3, wherein determining a remainder value comprises subtracting the primitive polynomial from the intermediate product via modulo-2 subtraction when the degree of the intermediate product equals the degree of the primitive polynomial.

7. The method of claim 1, wherein subjecting the represented equivalent class polynomial to a state transition function comprises:
multiplying the represented equivalent class polynomial by an inverse of a polynomial that is one of the plurality of elements comprising the multiplicative group to produce an intermediate product; and
adding the primitive polynomial from the intermediate product via modulo-2 addition when the least significant bit in the series of binary values is equal to one.

8. The method of claim 1, wherein decoding the series of binary values comprises comparing the series of binary values to a desired end state as each event is detected.

9. A multiplicative group counter apparatus for recording the number of events detected from an event source, comprising:
a series of flip-flops having an input, a clock input, and an output, the output of a last flip-flop in the series being connected to the input of a first flip-flop in the series of flip-flops and an event source being operatively connected to the clock input of each flip-flop; and
at least one logic gate, a given logic gate being operatively connected to at least two of the series of flip-flops as to receive the output of a first associated flip-flop in the series of flip-flops as a first input and to provide an output to a second associated flip-flop that follows the first associated flip-flop in the series of flip-flops, the at least one logic gate being configured such that after a given number of events are detected from the event source, a series of binary values stored in the series of flip-flops represents the detected number of events;
wherein each of the series of flip-flops represent a coefficient of one term of an equivalent class polynomial representing an element of a multiplicative group, and the given flip-flop receiving the output of each of the at least one logic gate being selected as to represent a primitive polynomial that produces a congruency between the equivalent class polynomial and the element of the multiplicative group.

10. The apparatus of claim 9, the at least one logic gate comprising an XOR gate, and each XOR gate receiving as a second input the output of a last flip-flop in the series of flip-flops.

11. The apparatus of claim 9, wherein the primitive polynomial has at least one intermediate term having a coefficient of one, and each of the at least one logic gate is configured to provide its output to a flip-flop from the series of flip-flops that represents one of the at least one intermediate term.

12. The apparatus of claim 9, the series of flip-flops and the at least one logic gate being implemented as one of an application specific integrated circuit, a field programmable gate array, a complex programmable logic device, a programmable array logic device, and a programmable logic device.

13. The apparatus of claim 9, further comprising a plurality of comparators that compare the series of binary values stored in the series of flip-flops to a desired end value.

14. A multiplicative group counter system for recording the number of events detected from an event source, comprising:
a register that stores a series of values representing coefficients of one of a plurality of equivalent class polynomials, wherein the plurality of equivalent class polynomials are congruent to a multiplicative group and a primitive polynomial produces the congruency between the plurality of equivalent class polynomials and the multiplicative group; and
a state transfer element that causes the series of values stored in the register to cycle through the plurality of equivalent polynomials in a known sequence in response to events detected from the event source, such that the number of events detected from the event source is represented by the series of values stored in the register.

15. The system of claim 14, further comprising a decoder element that translates the stored series of values into a value representing the number of events recorded by the counter.

16. The system of claim 15, the decoder element comprising at least one logic gate for comparing the series of values stored in the register to a series of values representing a desired end state for the register as each event is detected.

17. The system of claim 14, the register comprising a series of flip-flops having an input, a clock input, and an output, with the output of a last flip-flop in the series being connected to the input of a first flip-flop in the series of flip-flops and an event source being operatively connected to the clock input of each flip-flop.

18. The system of claim 17, the state transfer element comprising at least one logic gate, a given logic gate receiving as a first input the output of the last flip-flop in the series of flip-flops, receiving as a second input the output of a given flip-flop in the series of flip-flops, and providing an output to a flip-flop following the given flip-flop in the series of flip-flops.

19. The system of claim 14, the register and the state transition element being implemented as one of an application specific integrated circuit, a field programmable gate array, a complex programmable logic device, a programmable array logic device, and a programmable logic device.

* * * * *